United States Patent [19]

Nishizawa

[11] Patent Number: 4,819,058
[45] Date of Patent: Apr. 4, 1989

[54] SEMICONDUCTOR DEVICE HAVING A PN JUNCTION

[76] Inventor: Jun-ichi Nishizawa, No. 6-16, Komegafukuro 1-chome, Sendai-shi, Miygai-ken, Japan

[21] Appl. No.: 171,247

[22] Filed: Mar. 21, 1988

Related U.S. Application Data

[60] Continuation of Ser. No. 901,742, Aug. 29, 1986, abandoned, which is a division of Ser. No. 628,974, Jul. 10, 1984, Pat. No. 4,619,718, which is a continuation of Ser. No. 266,042, May 21, 1981, abandoned.

[30] Foreign Application Priority Data

Jun. 12, 1980 [JP] Japan .................................. 55-79805

[51] Int. Cl.[4] ............................................ H01L 33/00
[52] U.S. Cl. ........................................ 357/17; 357/61
[58] Field of Search .................................... 357/17, 61

[56] References Cited

U.S. PATENT DOCUMENTS

| 3,326,730 | 6/1967 | Mandel et al. | 357/61 X |
|---|---|---|---|
| 3,549,434 | 12/1970 | Aven | 357/61 X |
| 3,578,507 | 5/1971 | Chiang et al. | 357/17 X |
| 3,670,220 | 6/1972 | Kun et al. | 357/61 |
| 3,732,471 | 5/1973 | Hou et al. | 357/17 X |
| 3,745,073 | 7/1973 | Kun et al. | 357/17 X |
| 3,940,847 | 3/1976 | Park et al. | 357/17 X |
| 4,085,500 | 4/1978 | Hager et al. | 357/61 X |
| 4,105,472 | 8/1978 | Lancaster | 357/61 X |
| 4,105,478 | 8/1978 | Johnson | 357/61 X |
| 4,132,999 | 1/1979 | Maillé et al. | 357/61 X |
| 4,137,544 | 1/1979 | Koehler | 357/61 X |
| 4,263,604 | 4/1981 | Jensen et al. | 357/61 X |
| 4,377,904 | 3/1983 | Chapman et al. | 357/61 X |

OTHER PUBLICATIONS

Sze, S. M., "Physics of Semiconductor Devices", 2nd Ed., John Wiley and Sons, New York, 1981, p. 21.

Primary Examiner—Andrew J. James
Assistant Examiner—Sara W. Crane
Attorney, Agent, or Firm—Cushman, Darby & Cushman

[57] ABSTRACT

A method of manufacturing a semiconductor device by the use of a Group II–VI compound semiconductor crystal prepared by liquid growth method using a temperature difference technique under controlled vapor pressure of the crystal-constituting Group VI element. Thus, the concentration of vacancies and other defects acting as donor is reduced as compared with the concentration of the p type impurity to be introduced. This invention is suitable for producing light-emitting diodes emitting a light of short-wave lengths.

2 Claims, 2 Drawing Sheets

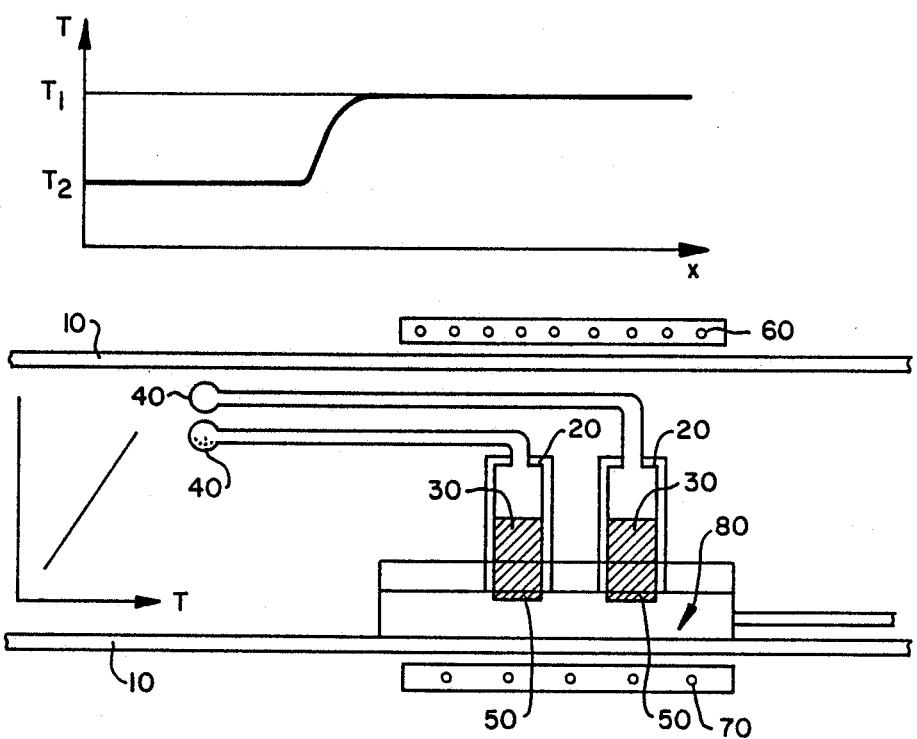

SEMICONDUCTOR DEVICE HAVING A PN JUNCTION

This is a continuation of Ser. No. 901,742, filed Aug. 29, 1986, which is abandoned in favor hereof, which was a divison of Ser. No. 628,974, filed July 10, 1984, which was allowed, which was a continuation of Ser. No. 266,042, filed May 21, 1981 (now abandoned).

BACKGROUND OF THE INVENTION (a) Field of the Invention

The present invention concerns a semiconductor device and its manufacturing method, and more particularly it pertains to pn junction semiconductor devices using Group II-VI compound semiconductors and their manufacturing method.

(b) Description of the Prior Art

Researches and developments of pn-junction light-emitting diodes which are so-called LED using various kinds of semiconductor materials are under way at present.

There have been manufactured and are being manufactured various different kinds of light-emitting devices having different light-emission wavelengths to comply with various different purposes. These wavelengths roughly range from infrared region to green color in the visible region. Some of their examples are as follows.

LEDs made of GaAs having an energy band gap of about 1.43 eV and doped with Zinc (Zn) emit light in the infrared region, whose peak intensity is about 9100 Å. LEDs made of GaP having an energy band gap of 2.26 eV doped with Zinc (Zn) and oxygen (O) emit light of red color of visible range, whose peak intensity is about 7000 Å. In case it is doped with nitrogen (N), the LED emits light of green color having its peak intensity at about 5500 Å or light of yellow color having its peak intensity at about 5800 Å. Also, in mixed crystals $GaAl_{1-x}P_x$ of GaP and AlP or in mixed crystals $GaAl_{1-x}As_x$ of GaAs and AlAs, it is known that, by varying the component ratio x or by varying the doping impurity, there are obtained LEDs emitting red color light having its peak intensity of about 6500 Å or yellow color light having its peak intensity of about 5900 Å.

The luminescence efficiency of these known LEDs is in the order of 0.01-5.00%, though varies depending on the materials employed.

The wavelength for the peak intensity of light which is emitted from an LED depends strongly on the energy band gap of the semiconductor material with which the LED is made, and this wavelength can vary depending on the manner in which pn junction is formed.

Theoretically speaking, the wavelength for light emission at peak intensity appears in a wavelength region longer (i.e. a wavelength having a smaller energy than $E_g$ of the semiconductor material) than the absorption edge of light (that is, the absorption edge agrees with the wavelength of light corresponding to the energy band gap $E_g$ of the semiconductor material) for the semiconductor material employed. The wavelength λ of the emission at peak intensity will become $\lambda_m$ which is expressed by:

$$\lambda_m = \frac{hc}{E_g} \approx \frac{1.24}{E_g(eV)} \ (\mu m)$$

or a greater wavelength having a lower energy than said $\lambda_m$, wherein:

h represents Planck's constant;

c represents velocity of light; and $E_g$ represents energy band gap of the semiconductor material employed.

As stated above, the wavelengths of the lights emitting from those LEDs which have been developed and put to practice in the past are, as discussed above, cover the range of color from the infrared region inclusive to green color of the visible region. In other words, the wavelengths of emitting lights of known LEDs extend up to about 5500 Å which is green color, and there has been provided no LEDs whose emitting lights have a higher energy than that mentioned above, i.e. a light of a short wavelength which, in term of color, is in the region of blue-gree, blue and violet. From the purposes of developing color electroluminescing devices and also of expanding the field of application of color LEDs, there is the demand for practicing such LEDs as having an emission wavelength of green color and such LEDs as emitting light of a wavelength shorter than that. Until now, however, no such LEDs have been obtained in the present state of technology.

As discussed above, in order to obtain an LED having such region of wavelength of emitting light, it is necessary to use semiconductor materials having an energy band gap broader than that of Group III-V compound semiconductors such as GaAs, GaP or $GaAl_{1-x}As_x$. As such semiconductors, there are, for example, Group II-VI compound semiconductors such as ZnSe ($E_g \approx 2.8$ eV), SiC ($E_g$ varies widely, one of which is $E_g \approx 3.3$ eV), or GaN ($E_g \approx 3.4$ eV). These semiconductors have broad energy band gaps, so that they have attracted the interest of researchers and have been studied. Nevertheless, owing to various technical problems, they have not been put to practice yet. Moreover, in a semiconductor material having a broad energy band gap, not only it is possible to obtain emission of light in the short wavelength region, but also to cause emission of light also in the long wavelength region by varying the recombination process of carriers. Especially, the Group II-VI compound semiconductors such as ZnSe stated above have broad energy band gap, and from a considerably long time ago, crystals have been produced either as photo-conductive semiconductor or as electroluminescent semiconductor. Their basic data have been accumlated in a large number and kind. As is well known, however, there has been technical difficulty in achieving free control of the conductivity types of Group II-VI compound semiconductors. In Table 1 are shown the conductivity type and energy band gap of Group II-VI compound semiconductors which have been obtained in the past not for the aspect of conductivity control but as a natural trend of development.

TABLE 1

|  | ZnS | ZnSe | ZnTe | CdS | CdSe | CdTe |
|---|---|---|---|---|---|---|
| Conductivity type | n | n | p | n | n | n<br>p |
| Energy | 3.6 eV | 2.8 eV | 2.2 eV | 2.5 eV | 1.74 eV | 1.5 eV |

TABLE 1-continued

| | ZnS | ZnSe | ZnTe | CdS | CdSe | CdTe |
|---|---|---|---|---|---|---|
| band gap | | | | | | |

The semiconductor materials listed in Table 1 invariably have a broad energy band gap, and will bring about a very effective result if LEDs are manufactured with them. As stated above, however, they do not permit free control of their conductivity type. For example, ZnS, CdS or ZnSe permit one to easily obtain a conductivity type of n type. However, even by doping an acceptor impurity in order to obtain p type, the result would be that the doped materials still remain to be n type or they could become crystals of either n type or p type having a very high resistivity. Even when the material happens to become p type, its control is not possible such that the material is not in such state as allowing the formation of pn junction necessary for an LED.

SUMMARY OF THE INVENTION

It is an object of the present invention to provide a semiconductor device having a desirable pn junction using Group II-VI compound semiconductors, by improving the physical manufacturing conditions which would bring about the above-stated undesirable result, and also to provide a method of manufacturing such semiconductor device.

Another object of the present invention is to provide a pn junction semiconductor device which is capable of emitting light of blue color region by the use of a ZnSe crystal, and a manufacturing method of same.

BRIEF DESCRIPTION OF THE DRAWINGS

FIG. 3 is a schematic diagram showing the method of manufacturing a pn junction ZnSe by relying on the epitaxial growth technique.

DETAILED DESCRIPTION OF THE PREFERRED EMBODIMENTS

Figure 1:
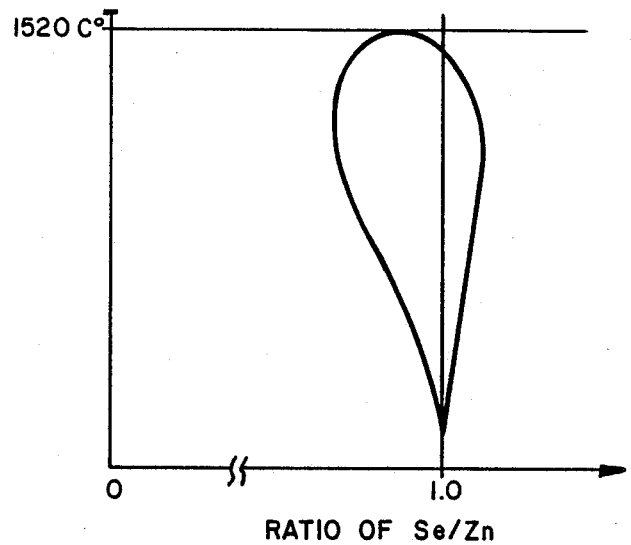
FIG. 1 is a schematic chart showing the relationship between the range of deviation from stoichiometry of a ZnSe crystal and the growth temperature.

Hereunder will be stated the reason why, in Group II-VI compound semiconductors such as ZnSe and CdS, one of the conductivity types can be easily formed, whereas the other conductivity type opposite thereto can not be formed, or even when it is formed, the crystal produced could be one having such high resistivity as being close to an insulator, and the reason why practically a pn junction is not obtained.

The stability of silicon as a semiconductor material is attributed to its being consisted of a single element. Because Group III-V compound semiconductors and Group II-VI compound semiconductors are comprised of two elements, these compound semiconductors have physical problems which are different from those of silicon.

Among the problems, the most important is the deviation from stoichiometry of the crystals. That is, even in Group III-V compound semiconductors and Group II-VI compound semiconductors both of which are comprised of two elements, the crystals desirably are such that the composition of the two elements is formed with the proportion which is perfectly 1:1. In an actual crystal, however, there are generated such defects as a considerably large number of vacancies or interstitial atoms during the course of manufacture of the crystal, as compared with the formation, though in much less number, of such defects as thermodynamic vacancies (lattice sites where some of the atoms are thermodynamically absent) or interstitial atoms, and as a result the two elements do not construct the lattice of crystal in the proportion of 1:1. A semiconductor crystal is obtained invariably after going through a heating step. In semiconductors such as Group II-VI or III-V compound semiconductors which are comprised of two elements, it should be understood that, when two constituting elements are compared with each other, that is, for example, Group II element as against Group VI element, or Group VI element as against Group V element, there exists a pretty large difference in vapor pressure between these two kinds of elements. Therefore, when a crystal is produced, there will be a considerably large deviation from stoichiometry. This deviation from stoichiometry occurs similarly in Group III-V compound semiconductors also. However, in Group II-VI compound semiconductors, the deviation from stoichiometry will more intensively and more complicatedly influence the conductivity type or impurity concentration. For example, in such semiconductors as ZnSe and CdS, it should be noted that Se and S have higher vapor pressure as compared with Zn and Cd. Therefore, in these crystals, there exist a number of vacancies of S sites and of Se sites, which serve to function as donor. In order to make a p type from these crystals by doping an impurity as acceptor during the heating step of manufacture, there are formed vacancies of S or Se, as donor, so as to compensate for the acceptor in order to thermodynamically establish stability. Accordingly, the resulting crystal easily tends to become a high-resistivity crystal. Such phenomenon is known as self-compensation effect.

Now, in the known method of growing semiconductor crystals of Group II-VI compound semiconductors such as ZnSe, there has not been performed the manufacture of crystal while freely controlling the vapor pressure of the easily vaporizing Se, as stated above. In contrast thereto, the "temperature difference method for crystal growth in liquid phase under controlled vapor pressure" as disclosed in, for example, my Japanese Patent Application No. Sho 48-11416, was firstly applied to Group III-V compound semiconductors, and was found to be very effective. It has been found, however, that this method can be effectively applied to Group II-VI compound semiconductors also (Japanese Patent Application filed on June 11, 1980 entitled "a method of growing crystal of Group II-VI compound semiconductors" proposed by the present inventor). Also, in case ZnSe is grown by relying on, for example, a known growth technique, a considerably high growth temperature is required. In case of growth done at melting point, the temperature is usually 1520° C., and in case of vapor transport growth, it is usually 1000° C. or higher. By relying on the temperature difference method, however, there can be performed a growth of sufficiently good crystal under much lower temperature as 900°-950° C. or lower than this level. This, deviation from stoichiometry due to vaporization of such Group VI element as S or Se can be remarkably suppressed.

That is, as shown in FIG. 1, the amount of the crystal's deviation from stoichiometry reduces progressively as the growth temperature becomes lower. The manner in which this progressive reduction of deviation varies exponentially in accordance with thermodynamics, and the deviation δ can be expressed by:

$$\delta + A \exp\left(-\frac{E}{kT}\right)$$

wherein:
A represents a constant;
k represents a Boltzmann constant;
T represents an absolute temperature °K.; and
E represents the energy for forming vacancy.

The reduction of δ means a reduction of the density of vacancies of S or Se. Moreover, according to the liquid phase crystal growth method under controlled vapor pressure, it is possible to arbitrarily control the applied vapor pressure during the course of growth. Accordingly, by the application of said temperature difference method for crystal growth under controlled vapor pressure, it becomes possible to suppress the self-compensation effect due to the generation of vacancies of S or Se, and to thereby form a desirable pn junction of Group II-VI compound semiconductors.

EXAMPLE 1

An n type ZnSe crystal which has been grown under controlled vapor pressure of Se is used as the substrate which may contain about 1% of Te. The manufacture of this substrate crystal requires to be performed under the following conditions. That is, the vapor pressure during the growth of said crystal requires to be held constant at a relatively high value, and the growth requires to be carried out at as low a temperature as possible, in order to insure that the deviation from stoichiometry is suppressed as small as possible, and that, even when an acceptor impurity is doped in the subsequent manufacturing step, there will not occur any large generation of vacancies due to self-compensation, i.e. to prevent the deviation from stoichiometry from becoming large. Concretely, in case of growth of ZnSe crystal, and in order to subsequently form a pn junction, the growth temperature of the substrate crystal is set at 1000° C. or lower, desirably 950° C. or lower, and the vapor pressure is set at 1 Torr or higher, desirably $10^2$ Torr or higher. By so doing, it becomes possible to reduce vacancy concentration, and also the subsequent formation of the pn junction becomes feasible. That is, it is necessary to perform the diffusion of a p type impurity at as low a temperature as posssible in order to suppress the generation of Se vacancies which are the donor during diffusion, as will be described later. By doing so, the concentration of the diffused acceptor impurity cannot become sufficiently large. The impurity concentration will become in the order of, for example, $10^{17}$ cm$^{-3}$ or lower. Accordingly, it is necessary to preliminarily arrange so that the substrate crystal will grow at as low a temperature as possible and under a high Se vapor pressure in order to reduce the vacancy concentration so as to be less than the abovesaid diffused effective p type impurity concentration. In order to subsequently form the pn junction, the grown substrate crystal is enclosed in a vacuum or an inert gas atmosphere such as argon in a quartz tube, followed by a diffusion of an acceptor impurity during as short a period of time as possible at a relatively low temperature, e.g. about 300° C.–about 600° C., as compared with the ordinary diffusion temperature, for the reasons stated above. In order to form a pn junction by diffusing an impurity at a low temperature, it is necessary to select the impurity which is to be used from among those having a large diffusion coefficient. For example, gold as an acceptor diffuses quickly at a low temperature. Gold takes about 3 minutes to diffuse to a depth of 1 μm at 300° C.–400° C. Also, silver diffuses quickly, and it takes only about 1 minute or less to diffuse to a depth of 1 μm.

As stated above, the diffusion of gold or silver can be performed at a remarkably low temperature and with large diffusion coefficient as compared with the ordinary instances of diffusion of Zn in Group III-V compound semiconductors or diffusion of boron (B) in silicon. Therefore, the diffusion of gold or silver can be accomplished during a period less than 1 hour. That is, these impurities a remarkably large diffusion coefficient than that of the Se vacancy which is generated due to vaporization of Se during the diffusing step. Because of the fact that the diffusion is done by the use of such impurity as mentioned above and at a low temperature and for a short period of time, it becomes possible to reduce the generation of vacancies and to obtain a p type region.

Figure 2:
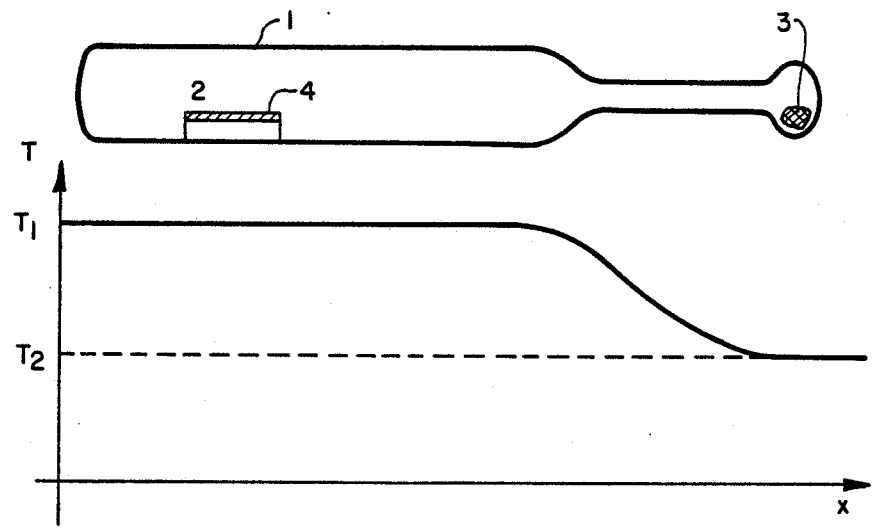
FIG. 2 is a diagram showing the method of diffusing gold as an impurity into a substrate crystal.

In case, however, the abovesaid gold or silver is diffused in an ordinary crystal such as ZnSe which has not experienced the control of vapor pressure, donor vacancies generate in a large number from the beginning of diffusion as well as in the midst of the diffusion step, making the formation of a pn junction difficult. Not only that, such impurity will form, in the forbidden band, deep levels which do not contribute to the emission of light, and also the impurity will serve to form a complex with the impurity and the vacancy. Thus, there is not obtained an emission of light. On the other hand, the concentration of Se vacancies in the substrate crystal which has been produced under controlled vapor pressure is markedly small. However, in case the diffusion of an impurity is performed in vacuum in place of an inert gas such as argon, there occurs escape of vaporized molecules of Se out of the crystal during the diffusing step. Therefore, the diffusion is performed in accordance with such diffusion system as shown in an example in FIG. 2. That is, a crystal substrate 2 deposited with an impurity source 4 such as a gold-deposited film which is to be subjected to diffusion, and a metal Se which is indicated by numeral 3 are enclosed separately from each other in a quartz tube 1 filled with an inert gas atmosphere such as argon. This quartz tube is placed in two different temperature zones, and diffusion is performed. The temperature $T_1$ in the zone in which the crystal substrate is placed and the temperature $T_2$ in the zone containing the metal Se are controlled independently of each other. Since the vapor pressure of Se is known, the temperature $T_2$ is determined so as to provide a required vapor pressure. In general, the Se pressure, desirably, is as high as possible, and accordingly $T_2$ desirably is high. In view of the fact that Se is readily transported to the first zone under the vapor pressure of Se, it should be understood that if $T_2$ is higher than $T_1$, there would occur an excessive transportation of Se into the first zone. It should be noted that, if the length of the diffusion time is short enough to insure a slight amount of transport of Se, the relation of $T_2 < T_1$ is not always necessary. In many practices, it is desirable to perform the diffusion of gold or silver at such examples of temperature as $T_1 = 350°$ C. and $T_2 = 330°$ C. The Se vapor pressure need at least 0.1 Torr or higher. In the above-mentioned Example, the Se vapor pressure is about 0.5 Torr. The result of this Example is that the generation of Se vacancies is remarkably scarce, and moreover hardly any self-compensation takes place. Therefore, the diffusion region becomes the p type. That is, during the period of diffusion, Se vapor is present in the atmosphere surrounding the substrate crystal. Accordingly, the Se almost ceases to evaporate from the substrate crystal. Thus, during the heat treatment step, the deviation from stoichiometry, i.e. the generation of Se vacancies becomes extremely mitigated. Also, self-compensation becomes hardly productive for the following reasons.

In ordinary cases, when an impurity which serves as an acceptor is doped, the free energy of the crystal as a whole will become elevated due to the presence of those holes which have been captured by the acceptor. Accordingly, under the condition that allows the generation of those vacancies of a Group VI element which serves as the donor and that, thereby, the acceptor impurity is compensated for, if the reduction of free energy due to the extinction of positive holes caused by the compensatory vacancies is greater than the increment of the free energy of the crystal as a whole due to the generation of vacancies, the free energy of the crystal as a whole will decrease, so that vacancies will generate in proportion to the amount of the doped acceptor impurity, so as to establish a stabilized state. Therefore, as a result, the deviation from stoichiometry will increase, and thus the crystal will not either become a p type or will become highly resistive.

However, if Se vapor is applied constantly onto the crystal during the diffusion step, the vacancy concentration will become substantially constant, in spite of the acceptor impurity, and moreover this vacancy concentration is very little. Thus, self-compensation becomes very difficult to take place. Unless the growth of the crystal which is to serve as the substrate is preliminarily done under a controlled vapor pressure, it is not easy to reduce the number of those vacancies which have already generated. Thus, the crystal is difficult to become a p type.

Although the impurity diffusion technique of applying a vapor pressure of the element constituting the semiconductor crystal during the diffusion of an impurity is already known. According to this technique, however, there has not been obtained a pn junction. The reason therefor is as follows. That is, because the vapor pressure control method is not used during the growth of the substrate crystal, there is obtained only such substrate crystal that has a remarkably large vacancy concentration. Thus, by the vapor pressure control at the time of subsequent diffusion of an impurity, such control of vapor pressure is not sufficient for a reduction of vacancies, and in addition, the diffusion time is short. Therefore, it is not possible to reduce the vacancies during such impurity diffusion.

Description will hereunder be made of the wavelength of the emitting light of a pn junction diode manufactured by relying on such method as stated above, by taking up, as an example, a ZnSe crystal. The energy band gap $E_g$ of ZnSe at room temperature is about 2.80 eV. On the other hand, the range of wavelengths from blue-green colors which are visible lights through to violet color is 5500 Å–4500 Å. When this range of wavelengths is viewed in terms of photon energy, it corresponds to the range of 2.25 ev–2.75 eV. Also, the donor level $E_p$ of the ZnSe crystal is about 0.03 eV–0.2 eV. Accordingly, in order to obtain the emission of light having a wavelength range of blue-green to violet colors, it should be understood that, in case the transition between the conduction band and the acceptor level dominates, the appropriate depth of the acceptor level is 0.55–0.05 eV as measured from the valence band, whereas in case the transition between the donor level and the acceptor level dominates, a depth of 0.4–0.02 eV is appropriate. Therefore, the acceptor level of an impurity which gives a p type conductivity requires to have a value of about 0.5 eV or lower as measured from the valence band. Moreover, it should be noted that, with the acceptor level of 0.5 eV, the ionization of positive holes at room temperature is too little. Thus, in order to give a good electric conduction, in general, the acceptor level desirably is shallow, and the adoption of such impurity as having a value of 0.2 eV or lower is more appropriate.

The characteristic, as an impurity, of gold has almost not been known in the past. However, in view of the finding that, when an LED is produced in practice, there is obtained a pn junction LED having a blue color light emission band, gold seems to have an acceptor level of 0.2 eV or lower. Some impurities whose acceptor levels are known for ZnSe crystal will be shown in Table 2. It should be noted, however, that silver can be used also for the formation of a pn junction. Attention has to be paid, however, to the fact that silver will also form a deep level of the order of 0.5 eV.

TABLE 2

| Impurity: | Au | Ag | Cu | Mg | P | As | Sb |
|---|---|---|---|---|---|---|---|
| Acceptor level (eV): | | 0.15 0.5 | 0.5 | | | 0.7 | 0.7 |

Even when an impurity diffusion is performed under a controlled vapor pressure, evaporation of Se will take place to some extent when the vapor pressure is not sufficiently high. Such evaporation of Se can be prevented from occurring if there is diffused such impurity as having a diffusing velocity sufficiently greater than the velocity with which diffuses, into the interior of the crystal, the Se vacancies which are located near the surface region of the crystal and produced due to the abovesaid evaporation of Se, and if this impurity diffusion is completed during a short period of time.

As such impurity as mentioned above, gold is especially effective.

EXAMPLE 2

An n type ZnSe substrate crystal which has been grown under a controlled vapor pressure is used. A growth layer of p type ZnSe is formed, by relying on the epitaxial growth technique, on the substrate under an Se vapor presure. This epitaxial growth method adops the liquid phase growth amnd employs an apparatus similar to the controlled vapor pressure type epitaxial growth apparatus which is used for Group III–V compound semiconductors. An example thereof is shown in FIG. 3.

On a slider 10 made of carbon and housed within a quartz tube not shown are placed said substrates 50, 50. In the melt bath vessels 20, 20 are placed batches of a mixed melt metal of Zn, Te and Se. In a certain method, the top of each melt bath vessel 20 is covered with a lid to provide air-tightness of the vessel, and the ratio of Te and Se of the mixed melt metal is set at a desired value. In FIG. 3, however, there is shown a method of imparting, through the quartz tube, a predetermined Se vapor pressure from regions 40, 40 in which is placed Se heated at a temperature $T_2$. And also, at the outside of quartz tube 10 and at sites sandwiching therebetween the mixed melt metal bath vessel 20 and 20 and also the substrates 50 and 50, there are provided an upper heater 60 and a lower heater 70. The temperature of the upper heater 60 is set to be higher than that of the lower heater 70. Thus, liquid-phase crystal growth is accomplished by the virtue of the temperature difference produced.

In the mixed melt metal of Te and Se, Te serves as the solvent. Since this mixed metal contains Se, and since this Example relies on the temperature difference method, the liquid phase growth can be accomplished at a temperature of 1000° C. or lower. Moreover, because the segregation coefficient of Te into the crystal is very small, the Te content in the grown layer becomes 1% or less, and because the grown layer, substantially, is a ZnSe crystal and also because the growth is subjected to controlled vapor pressure, the formed crystal features a minimized Se vacancy concentration.

Into the melt is doped an impurity such as gold, silver or phosphor which are listed in Table 2. Since the epitaxial growth layer can be small in thickness, it is desirable from the viewpoint of the pn junction characteristic to carry out the growth thereof at a temperature of 800°–400° C. which in much lower than 950°–900° C. which are known examples of temperature for growing a substrate crystal. Since according to the present invention, a crystal can be manufactured at a temperature much lower than the temperature required for ordinary diffusion of impurity, the range of deviation from stoichiometry is narrow. Therefore, the Se vacancy concentration or the concentration of its complex with impurity and vacancy is lowered further, and as a result, there can be obtained a diode which emits a colored light of blue-green.

The above-described method of forming pn junction can be applied equally effectively to ZnS, CdS and CdSe, in addition to ZnSe. In case it is intended to obtain a blue-green light-emitting diode, it should be appreciated that ZnS has a broad gap of forbidden band, and that accordingly the impurity level naturally will become relatively deep, and for this reason the employment of ZnS is not so desirable. Also, ZnTe, CdSe and CdTe have a too narrow energy band $E_g$. CdS has a band gap of 2.5 eV. Thus, it is suitable as an LED emitting a green light or yellow light, if the value of acceptor level is subtracted from the value of the energy band gap.

Those impurities of Group II–VI compound semiconductors could form two or more acceptor levels such as silver shown in Table 2. In such instance, not only there can be a transition of emitting a blue color light in case of ZnSe, but also there can be the instance that also the transition of emitting a red or yellow color light takes place concurrently. In such case, an emission of an almost genuine blue color light can be obtained by the inclusion of a substance such as $Fe_2O_3$ which absorbs the light in the red and yellow band in the epoxy resin which covers the LED.

What is claimed is:

1. A blue and green light-emitting device, comprising:
   a single crystal pn junction formed in an n-type ZnSe compound semiconductor crystal;
   said n-type ZnSe compound semiconductor crystal having been formed by a temperature difference method under controlled vapor pressure, in which:
   a solution containing component semiconductor elements is formed;
   a temperature difference is established vertically in said solution so as to provide a higher temperature region and a lower temperature region;
   a seed crystal is disposed in said low temperature region;
   the temperature difference between said high temperature region and said low temperaure region is maintained constant, and a vapor pressure of at least one of said component semiconductor elements is applied to an enclosed headspace in contact with said solution, to thus form said n-type ZnSe compound semiconductor crystal with a relatively low density of component vacancies and to minimize deviation from stoichiometric composition; and
   a p-type ZnSe compound semiconductor of said single crystal pn junction having been formed by diffusing Au or Ag onto a surface of said n-type ZnSe compound semiconductor crystal with a higher concentration and a larger diffusion coefficient than said component vacancies.

2. A blue and green light emitting device according to claim 1, wherein:
   the ZnSe has a Te content of 1% or less.

* * * * *